United States Patent
Sudo et al.

(10) Patent No.: US 10,515,668 B2
(45) Date of Patent: *Dec. 24, 2019

(54) LOW PERMEABILITY ELECTRICAL FEED-THROUGH

(71) Applicant: Western Digital Technologies, Inc., San Jose, CA (US)

(72) Inventors: Kimihiko Sudo, Yokohama (JP); Seong-Hun Choe, Fujisawa (JP); Kazuhiro Nagaoka, Fujisawa (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/449,310

(22) Filed: Jun. 21, 2019

(65) Prior Publication Data
US 2019/0304510 A1  Oct. 3, 2019

Related U.S. Application Data

(62) Division of application No. 15/672,779, filed on Aug. 9, 2017.

(51) Int. Cl.
*G11B 33/12* (2006.01)
*G11B 33/14* (2006.01)
*H01L 39/24* (2006.01)

(52) U.S. Cl.
CPC .......... *G11B 33/122* (2013.01); *G11B 33/148* (2013.01); *H01L 39/24* (2013.01)

(58) Field of Classification Search
CPC ...... G11B 33/122; G11B 33/148; H02G 3/22; H01L 39/2467
See application file for complete search history.

(56) References Cited

U.S. PATENT DOCUMENTS

| | | |
|---|---|---|
| 6,016,000 A | 1/2000 | Moslehi |
| 6,970,322 B2 | 11/2005 | Bernett |
| 6,989,493 B2 | 1/2006 | Hipwell, Jr. et al. |
| 7,019,942 B2 | 3/2006 | Gunderson et al. |
| 7,137,196 B2 | 11/2006 | Gunderson et al. |
| 7,599,147 B2 | 10/2009 | Gunderson |
| 7,662,653 B2 | 2/2010 | O'Brien et al. |
| 8,035,923 B2 | 10/2011 | Suzuki et al. |
| 8,059,364 B1 | 11/2011 | Andrikowich et al. |
| 8,098,454 B2 | 1/2012 | Kouno et al. |
| 8,194,348 B2 | 6/2012 | Jacoby et al. |
| 8,593,760 B2 | 11/2013 | McGuire, Jr. |

(Continued)

FOREIGN PATENT DOCUMENTS

EP   0844899 B1   7/2003

*Primary Examiner* — Brian E Miller
(74) *Attorney, Agent, or Firm* — John D. Henkhaus

(57) ABSTRACT

A low permeability electrical feed-through involves a laminate structure having alternating conductive and insulating layers with a conductive through-hole positioned therethrough, by which a lower connector pad is electrically connected with an upper connector pad. Such a feed-through may be used at an interface between a hermetically-sealed internal environment, such as in a lighter-than-air gas filled data storage device, and the external environment. An insulating layer is positioned and configured such that an associated horizontal leak path can meet an allowable feed-through leak rate, while the collection of layers is configured such that an associated vertical leak path can meet the feed-through leak rate.

8 Claims, 6 Drawing Sheets

(56) References Cited

U.S. PATENT DOCUMENTS

| | | |
|---|---|---|
| 9,196,303 B2 | 11/2015 | Hirano et al. |
| 9,431,759 B2 | 8/2016 | Hirano et al. |
| 9,490,620 B1 | 11/2016 | Albrecht et al. |
| 9,558,790 B1 | 1/2017 | Onobu et al. |
| 9,704,539 B2 | 7/2017 | Sudo et al. |
| 9,736,940 B2 | 8/2017 | Albrecht et al. |
| 2004/0057589 A1 | 3/2004 | Pedersen et al. |
| 2011/0211279 A1 | 9/2011 | Jacoby et al. |
| 2015/0139770 A1 | 5/2015 | Moura et al. |
| 2017/0169862 A1 | 6/2017 | Sudo et al. |

LOW PERMEABILITY ELECTRICAL FEED-THROUGH

CROSS-REFERENCE TO RELATED APPLICATIONS

This application is a divisional of and claims the benefit of priority to U.S. patent application Ser. No. 15/672,779, filed Aug. 9, 2017, now U.S. Pat. No. 10,395,694, the entire content of which is incorporated by reference in its entirety for all purposes as if fully set forth herein.

FIELD OF EMBODIMENTS

Embodiments of the invention may relate generally to hermetically sealed hard disk drives and particularly to controlling gas leakage through an electrical feed-through.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack, and the mechanical power used by the disk spindle motor is substantially reduced. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the absence of corrosive gases or contaminants.

Electronic systems that require hermetically sealed internal volume (e.g., a lighter-than-air gas filled, sealed HDD or system of HDDs) need a way of connecting electrical lines through the enclosure. This is typically accomplished with a hermetic electrical connector, or electrical "feed-through". One possible approach may involve the use of a low permeability but relatively expensive feed-through, such as glass-metal feed-through. Another approach may involve the use of a low-cost printed circuit board (PCB) feed-through, but these typically have a higher leak rate.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a low permeability electrical feed-through are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of electrical feed-through for digital storage device (DSD), such as a hard disk drive (HDD), and in the context of a system of multiple DSDs/HDDs. Thus, in accordance with an embodiment, a plan view illustrating an HDD 100 is shown in FIG. 1 to illustrate an exemplary operating context.

Figure 1:
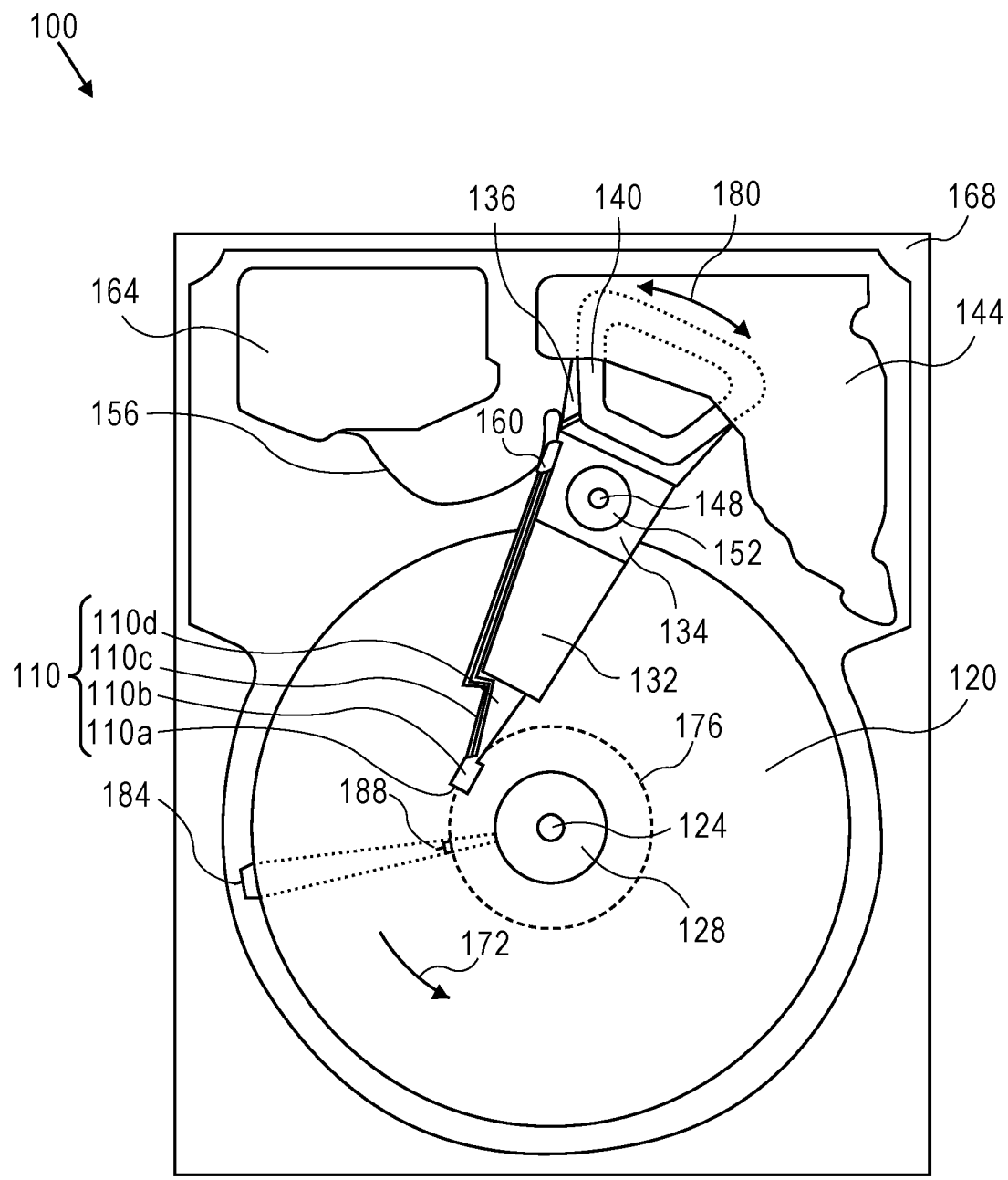
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable"). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110*b* rides so that the slider 110*b* flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "hermetically-sealed", "negligible leakage", "no leakage", etc. may be used herein, note that such a system would often still have a certain amount of permeability and, therefore, not be absolutely leak-free. Hence, the concept of a desired or target "leak rate" may be used herein.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

Recall that electronic systems that require hermetically sealed internal volume (e.g., a lighter-than-air gas filled, sealed HDD or system of HDDs) need a way of connecting electrical lines through the enclosure, with one approach utilizing a hermetic electrical connector or electrical "feed-through". However, challenges remain regarding a low leakage rate versus the cost of a suitable electrical feed-through.

Figure 2:
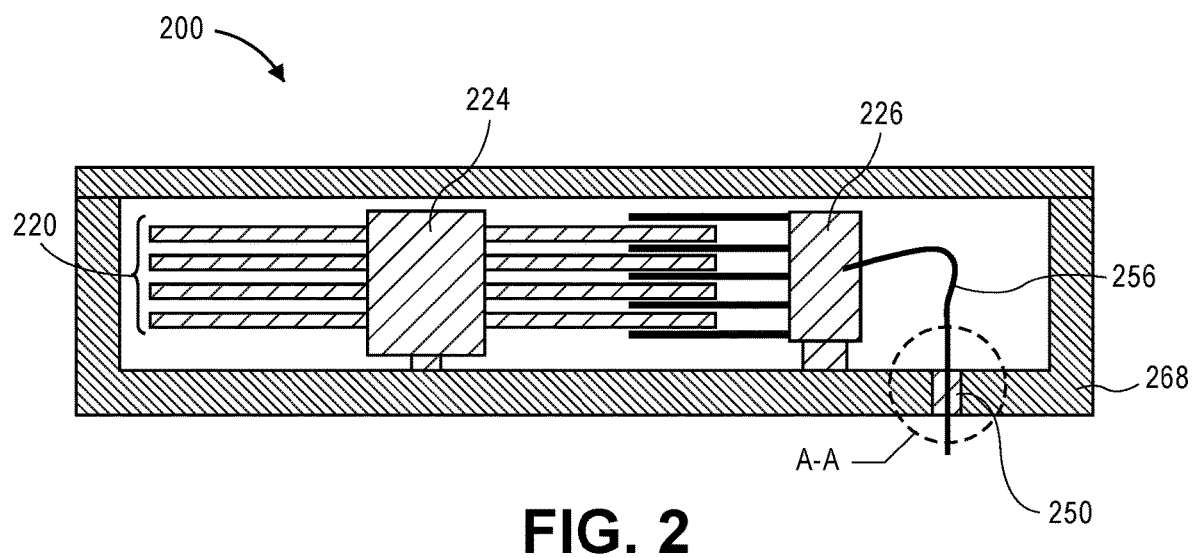
FIG. 2 is a cross-sectional side view illustrating a hard disk drive (HDD), according to an embodiment.

FIG. 2 is a cross-sectional side view illustrating a hard disk drive (HDD), according to an embodiment. For example, HDD 200 comprises at least one recording medium 220 (e.g., such as magnetic-recording medium 120 of FIG. 1) rotatably mounted on a spindle 224 (e.g., such as spindle 124 of FIG. 1) of a drive motor that drives the rotation of the recording medium 220, and a head stack assembly (HSA) 226 that carries and moves a head slider housing a read-write transducer to locations over the recording medium 220 for reading information from and writing information to the recording medium 220. HDD 200 further comprises a flexible cable assembly (FCA) 256 that electrically connects the HSA 226 to an electronic component external to the hermetically-sealed internal environment of HDD 200, such as to a printed circuit board (e.g., an "SOC", or system-on-a-chip) that may be coupled to the HDD 200. In so doing, the FCA 256 is routed through an interface 250 (e.g., mechanical and/or electrical), which includes a small opening, which is associated with an HDD enclosure base 268 (e.g., similar to a hermetically-sealed version of HDD housing 168 of FIG. 1). FIG. 2 further illustrates an area A-A near and including the interface 250, which may be referenced elsewhere herein.

Low Permeability Electrical Feed-Through

Figure 3A:
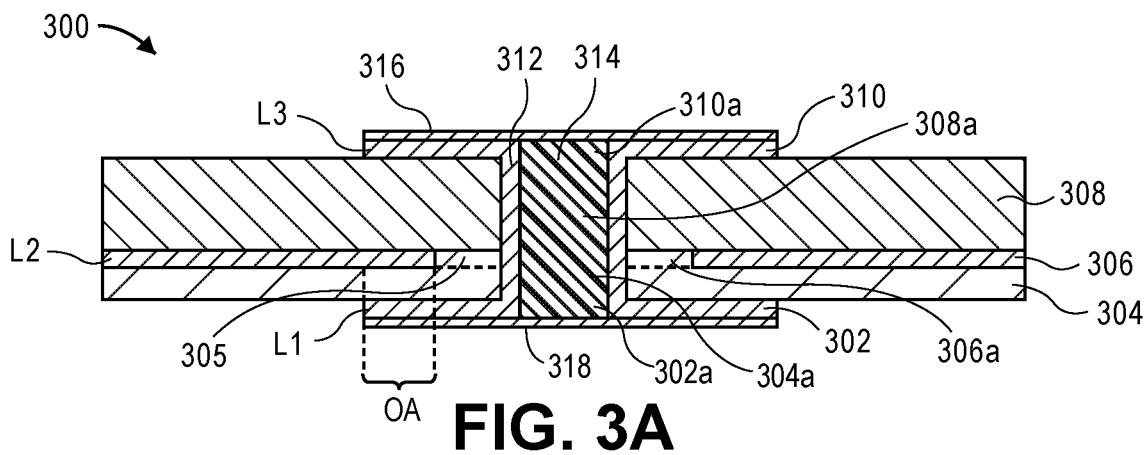
FIG. 3A is a cross-sectional side view of a low permeability electrical feed-through, according to an embodiment.

FIG. 3A is a cross-sectional side view of a low permeability electrical feed-through, according to an embodiment. Electrical feed-through 300 (hereinafter, "feed-through 300") may be referred to as a PCB (printed circuit board) based feed-through, fabricated using materials and processes generally associated with PCBs. One advantage of using PCB-based components, generally, and a PCB-based electrical feed-through, specifically, is the relatively low cost associated with a now mature fabrication approach.

With reference to the view of FIG. 3A, the construction of feed-through 300 is considered from the bottom of the view to the top of the view. Note, however, that an electrical feed-through such as feed-through 300 may not have a true top and a true bottom so terms such as "top" and "bottom" are used herein for purposes of reference and relative positioning rather than for a characterization of how feed-through 300 may be manufactured or assembled or installed as a sub-component of a larger, higher-level component (for a non-limiting example, a hermetically-sealed hard disk drive).

According to an embodiment, starting from the bottom of the view of FIG. 3A, feed-through 300 comprises a laminate structure having a first layer of conductive material, or first conductor layer (L1) 302. For example, the first conductor layer 302 may be composed of copper, according to an embodiment. First conductor layer 302 comprises a through-hole 302a (e.g., "L1 through-hole"). Over the first conductor layer 302 sits a first insulator material, or first insulator layer (I1) 304, comprising a through-hole 304a (e.g., "I1 through-hole") coaxial with the L1 through-hole 302a.

According to an embodiment, the first insulator layer 304 comprises or is composed of a fiberglass material (e.g., a fiberglass fabric or cloth) that is pre-impregnated with epoxy resin (may be referred to in the art as "glass-epoxy resin", "glass-epoxy pre-preg", "epoxy resin prepreg", and the like). Typically, within a glass-epoxy resin, there are "horizontal" layers or areas of epoxy resin (e.g., only) between layers or areas of the glass fabric, thus imparting anisotropic gas leakage properties to the glass-epoxy resin. That is, a gas leak rate through a piece of glass-epoxy resin is greater in the horizontal direction (e.g., travelling horizontally along/through the resin layers) than in the vertical direction (e.g., travelling vertically through the resin and glass layers), the relevance of which is herein described in more detail in reference to FIG. 4A.

Over a first portion of the first insulator layer 304 sits a second layer of conductive material, or second conductor layer (L2) 306, comprising a through-hole 306a (e.g., "L2 through-hole") coaxial with the I1 through-hole 304a. Further, the second conductor layer 306 is coplanar with a second portion 305 of the first insulator layer 304, i.e., the first insulator material 304 extends up into an area devoid of but coplanar with the second conductor layer 306. For example, the second conductor layer 306 may be composed of copper, according to an embodiment. According to an embodiment, the second conductor layer 306 overlaps in part with the first conductor layer 302, the significance of which is described in more detail elsewhere herein. Over the second conductive layer 306 and the second portion 305 of the first insulator layer 304, lies a second insulator material, or second insulator layer (I2) 308, comprising a through-hole 308a (e.g., "I2 through-hole") coaxial with the L2 through-hole 306a. According to an embodiment, the second insulator layer 308 comprises or is composed of a copper-clad laminate of fiberglass material (e.g., a fiberglass fabric or cloth) that is pre-impregnated with epoxy resin. Copper-clad refers to the glass-epoxy material being coated in a copper foil on both sides, which in this scenario is useful for imparting lower gas permeability to the glass-epoxy resin.

Over the second insulator layer 308 sits a third layer of conductive material, or third conductor layer (L3) 310, comprising a through-hole 310a (e.g., "L3 through-hole") coaxial with the I2 through-hole 308a. For example, the third conductor layer 310 may be composed of copper, according to an embodiment. The first conductor layer 302 and the third conductor layer 310 are electrically connected by way of a fourth layer of conductive material, or an electrically conductive annulus 312 (e.g., functioning as a via), covering an inside of the collective of through-holes 302a, 304a, 306a, 308a, 310a. As depicted in FIG. 3A, the conductive annulus 312 is a continuous ring or tube-like structure that extends through the collection of through-holes, thereby connecting L1 with L3. According to an embodiment, the conductive annulus 312 is filled with a resin material 314, such as an embedded resin embedded with a low permeability material and/or particles, to inhibit gas leakage through the collection of through-holes 302a, 304a, 306a, 308a, 310a.

According to an embodiment, formed over the third conductor layer 310, feed-through 300 further comprises an electrical pad conductive material which, in conjunction with the third conductor layer 310, forms an upper electrical connection or connector pad 316. Further, formed over the first conductor layer 302, feed-through 300 further comprises an electrical pad conductive material which, in conjunction with the first conductor layer 302, forms a lower electrical connection or connector pad 318.

Figure 3B:
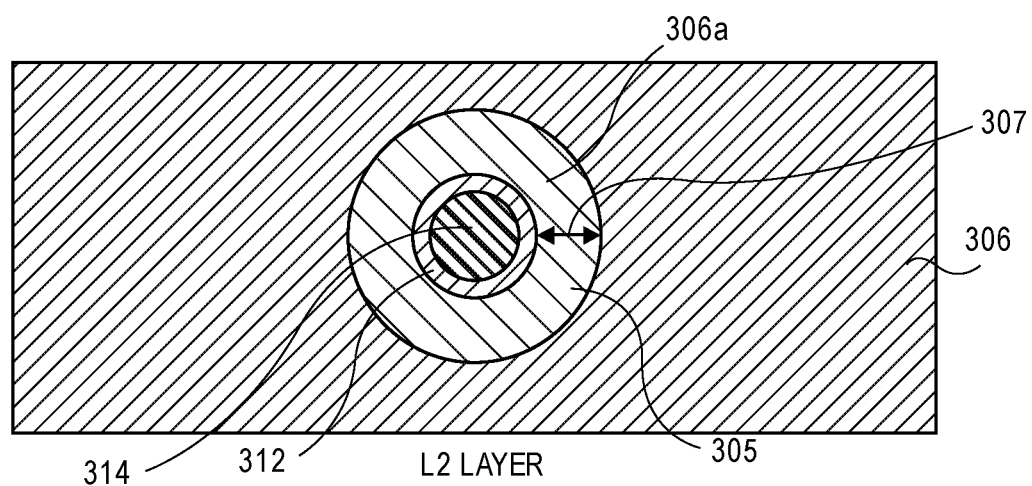
FIG. 3B is a plan view of layer L2 of the low permeability electrical feed-through of FIG. 3A, according to an embodiment.

FIG. 3B is a plan view of layer L2 of the low permeability electrical feed-through of FIG. 3A, according to an embodiment. FIG. 3B illustrates the second conductor layer (L2) 306 with the L2 through-hole 306a, which is in part filled with the second portion 305 of the first insulator layer 304 (FIG. 3A). With reference radially inward, next is depicted the conductive annulus 312 filled with the resin material 314. The relevance of this ring structure illustrated in FIG. 3B is herein described in more detail in reference to FIG. 4B.

Figure 3C:
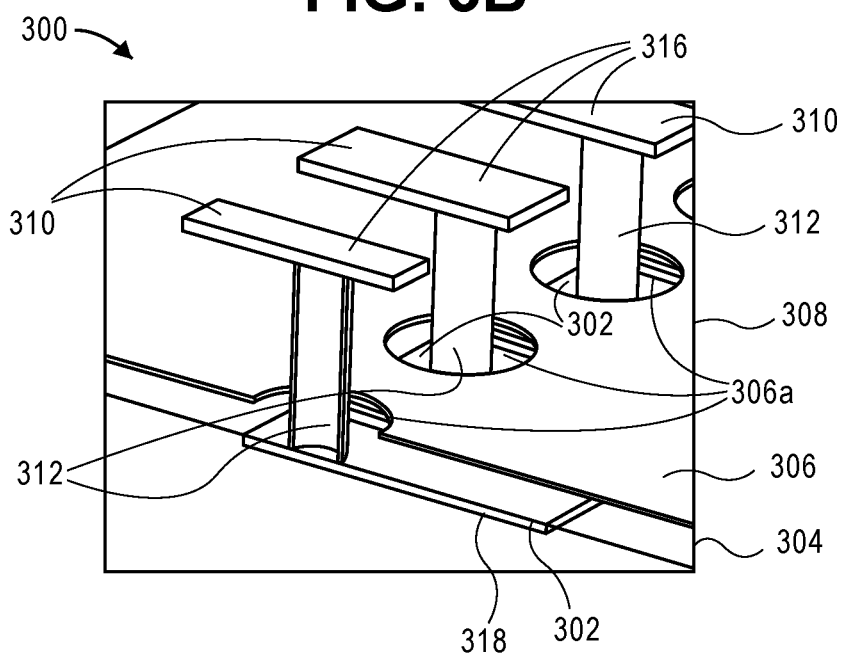
FIG. 3C is a transparent perspective view of the low permeability electrical feed-through of FIG. 3A, according to an embodiment.

To provide more visualization of the feed-through 300, and to show that there may be multiple vertical electrical interconnect structures (i.e., vias) constituent to the feed-through 300, FIG. 3C is a transparent perspective view of the low permeability electrical feed-through of FIG. 3A, according to an embodiment. The view of FIG. 3C is referred to as "transparent" because the insulator layers are depicted transparently rather than opaquely in order to see the underlying structural features that might otherwise be hidden from view. FIG. 3C illustrates a plurality of first conductor layers (L1) 302 plated with respective lower electrical connector pads 318, over which sits the first insulator layer (I1) 304, over which sits the second conductor layer (L2) 306 including the respective L2 through-holes 306a. Continuing, the second insulator layer (I2) 308 sits over the second conductor layer 306, over which sits a plurality of third conductor layers (L3) 310 plated with respective upper electrical connector pads 316. Also shown in FIG. 3C is an electrically conductive annulus 312 extending between each first conductor layer 302 and corresponding third conductor layer 310, and thereby providing electrical connectivity between these L1 and L3 layers.

Functional Features of a Low Permeability Electrical Feed-Through

One possible implementation of a low permeability electrical feed-through such a feed-through 300 may be for use with a sealed hard disk drive that includes a hermetically sealed gas-filled (e.g., a lighter-than-air type gas, such as helium, nitrogen, etc., for non-limiting examples) enclosure that has an opening extending through an HDD base (e.g., similar to HDD enclosure base 268 of FIG. 2). In such an implementation, an electrical connector may be disposed inside the enclosure and adjacent to the opening, and which can be electrically connected to a low permeability electrical feed-through such as feed-through 300 which spans the opening (see, e.g., interface 250 of area A-A of FIG. 2). For example, an electrical connector may be electrically connected with an internal HDD flexible interconnect cable (e.g., FCA 256 of FIG. 2), and with the feed-through 300 by way of connector pads 316 or 318. Alternately, an internal HDD flexible interconnect cable (e.g., FCA 256 of FIG. 2) may be directly connected with the feed-through 300 by way of connector pads 316 or 318. Similarly, an electrical connector may be electrically connected to an external HDD PCB (i.e., attached to the HDD) and with the feed-through 300 by way of connector pads 316 or 318. Broadly, feed-through 300 serves the purpose of facilitating electrical contact and connection between the outside and inside of the hermetically sealed cavity/enclosure.

Figure 4A:
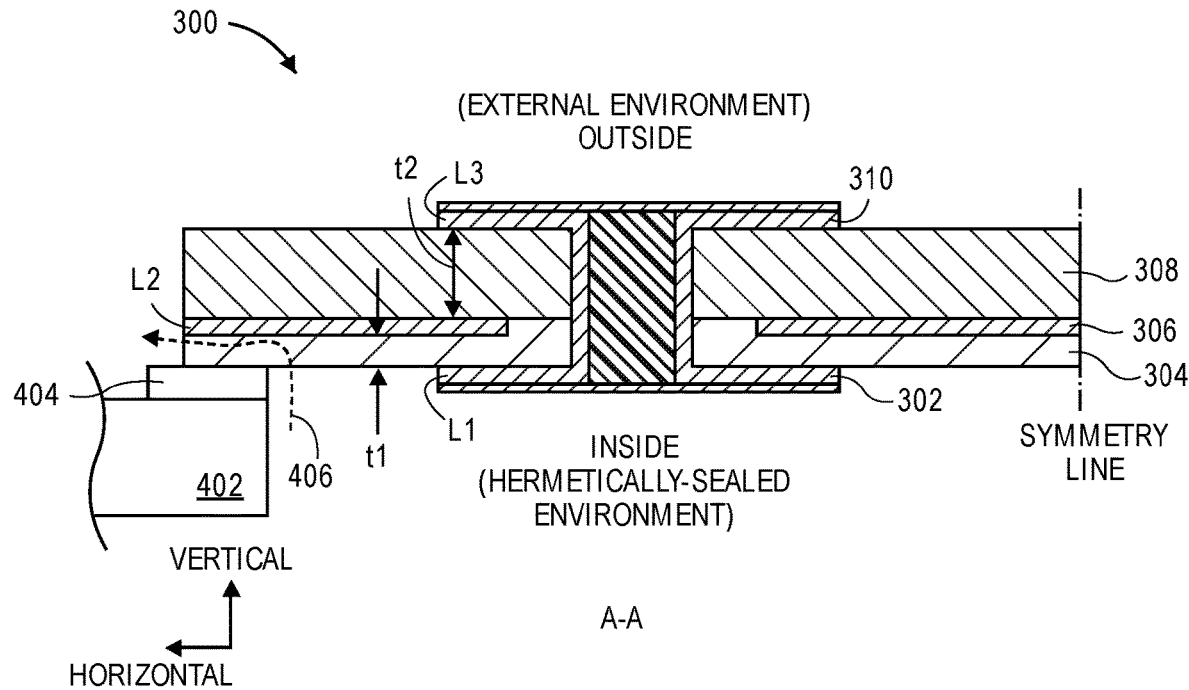
FIG. 4A is a cross-sectional side view of a low permeability electrical feed-through mounted in an electronic component, according to an embodiment.

FIG. 4A is a cross-sectional side view of a low permeability electrical feed-through mounted in an electronic component, according to an embodiment. Feed-through 300 is shown mounted at an interface (see, e.g., interface 250 of area A-A of FIG. 2) between a hermetically-sealed environment (e.g., inside a hermetically-sealed data storage device (DSD), such as a hard disk drive (HDD), or a system of multiple DSDs) and an external environment (e.g., ambient air outside of the electronic component). Feed-through 300 is shown coupled with an enclosure base 402 (see, e.g., HDD housing 168 of FIG. 1) by way of some type of adhesive 404, which may vary from implementation to implementation.

Recall that a glass-epoxy resin material, which may be used to form the first insulator layer 304, has anisotropic leak rate properties. Hence, according to an embodiment, the first insulator layer 304 is positioned within the feed-through 300 such that the leak rate is lesser in the vertical direction that in the horizontal (or radial) direction. That is, the aforementioned layers or bands of resin that are laid up within the glass-epoxy resin material of the first insulator layer 304 are generally positioned horizontally within the feed-through 300. Consequently, a gas diffusion path through the first insulator layer, i.e., between the inside environment and the outside environment, is intentionally biased in the horizontal direction (as depicted by dashed arrow 406, generally depicting a leakage or diffusion path to the outside). Such bias may be enabled not only by the horizontal positioning of the internal composition of a glass-epoxy resin-based first insulator layer 304, but also by the presence of the second conductor layer 306 which is composed of a relatively less permeable metal material (e.g., copper) than the insulator layers.

Furthermore, and according to an embodiment, the thickness (t1) of the first insulator layer 304 is held to less than the thickness (t2) of the second insulator layer 308, at least in part to provide a longer, narrower (less leaky) horizontal diffusion path through the first insulator layer 304 in the radial direction(s) or plane than in the vertical direction through the first and second insulator layers 304, 308. While applying constraints upon the thickness t1 of the first insulator layer 304 for leakage inhibition purposes, the thickness t2 of the second insulator layer 308 may be enlarged as necessary for purposes of increasing the structural rigidity of a feed-through such as the feed-through 300.

However, recall (with reference to FIG. 3A) that the second conductor layer 306 may overlap in part with the first conductor layer 302. This overlap area is denoted as "OA" in the illustration of FIG. 3A, and the space between this overlap area may be characterized as a "capacitance area" because the two conductive layers acts as a capacitor, with the corresponding capacitance being proportional to the surface area of the conductive "plates" and inversely proportional to their distance apart. It is known that parasitic capacitance (e.g., an unavoidable and usually undesirable capacitance between parts of a circuit) can have a significantly deleterious and therefore unwanted effect on high frequency circuits and the high frequency signals transmitting therethrough. Hence, a challenging design conflict exists in relation to the foregoing benefit of having a relatively thin first insulator layer 304 with respect to lowering the leak rate, and the corresponding detriment imposed by decreasing the distance between the first conductor layer 302 and the second conductor layer 306 at the overlap capacitance area (due to thinner t1), which produces a larger undesirable capacitance effect on associated high frequency signals. Hence, one might attempt to minimize the undesirable capacitance forthcoming from the decreased L1-L2 distance by minimizing the amount of overlap surface area (overlap area OA) between L1 and L2. Preferably, a non-limiting ratio of OA to the thickness t1 of the first insulator layer 304 is held to less than 10 or so, in order to implement a compromise solution for the foregoing design conflict. Generally, a high-frequency signal in the context of embodiments described herein is a signal having a frequency greater than several hundreds of megahertz, in order to achieve the data rate(s) specified in relevant interface protocols (e.g., SAS, SATA) for example. Further, a high-frequency signal transmission line is in contrast with, for example, power lines, ground lines, control lines, and the like.

Figure 4B:
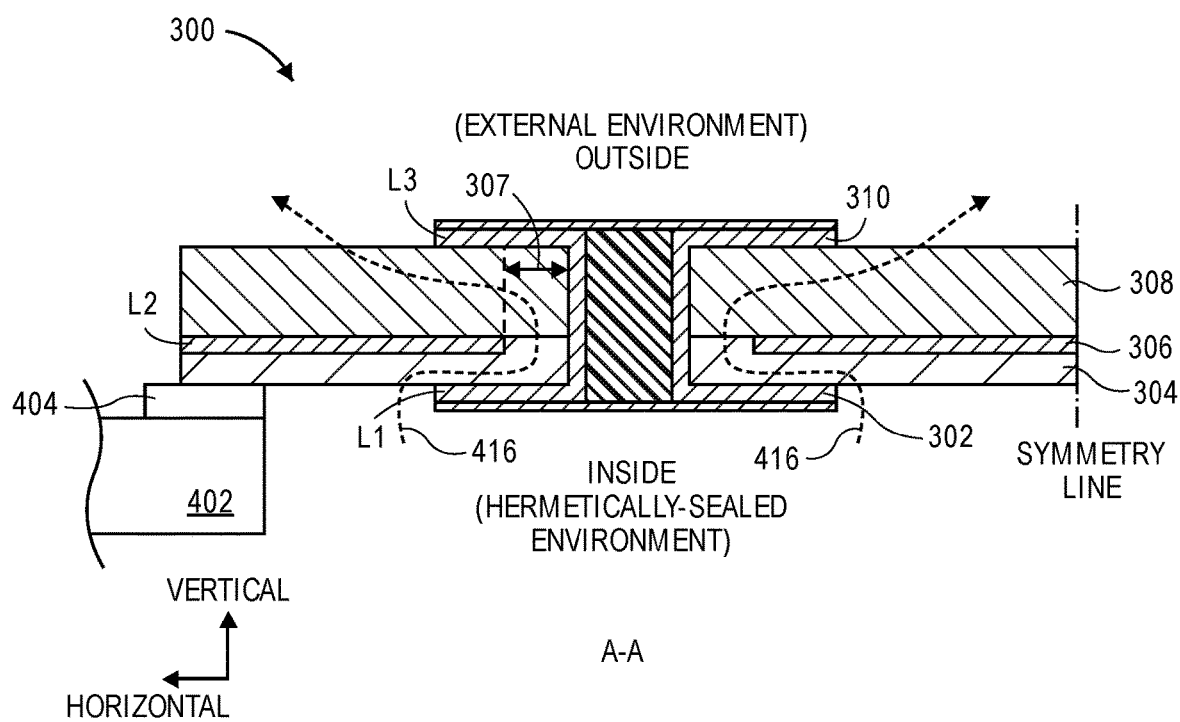
FIG. 4B is a cross-sectional side view of a low permeability electrical feed-through mounted in an electronic component, according to an embodiment.

FIG. 4B is a cross-sectional side view of a low permeability electrical feed-through mounted in an electronic component, according to an embodiment. As with FIG. 4A, feed-through 300 is shown mounted at an interface (see, e.g., interface 250 of area A-A of FIG. 2) between a hermetically-sealed environment (e.g., inside a hermetically-sealed data storage device (DSD), such as a hard disk drive (HDD), or a system of multiple DSDs) and an external environment (e.g., ambient air outside of the electronic component). Feed-through 300 is shown coupled with an enclosure base 402 (see, e.g., HDD housing 168 of FIG. 1) by way of some type of adhesive 404, which may vary from implementation to implementation.

Recall the coaxial, concentric ring structure illustrated in the plan view of FIG. 3C (e.g., at the second conductor layer (L2) 306). Reference is now made to the circuitous diffusion path or leak path through the ring structure (as depicted by dashed arrow 416 in FIG. 4B). As discussed, the second conductor layer (L2) 306, being a metal that is more impervious to leakage of small gas molecules (e.g., helium), functions to inhibit gas leakage from the inside hermetically-sealed environment to the outside external environment. Additionally, the circuitous vertical diffusion path that the gas would have to take to leak to the external environment in the context of the concentric ring structure, i.e., through the first insulator layer 304 around the first and second conductor layers 302, 306, and then through the second insulator layer 308 around the second and third conductor layers 306, 310, is based at least in part on the distance 307 (or radial length) of the second portion 305 of the first insulator layer 304 between the conductive annulus 312 and the second conductor layer 306. Hence, the size of the through-hole 306a, which sets the distance 307, may vary from implementation to implementation based, for example, on a target or permissible leak rate through the feed-through 300. It is appreciated, however, that shortening the distance 307 in order to shrink the vertical diffusion path through the first and second insulator layers 304, 308 is at the expense of increasing the overlap area OA (FIG. 3A) associated with the first and second conductor layers 302, 306, and the corresponding capacitive effect deriving therefrom.

Method of Manufacturing an Electrical Feed-Through

Figure 5:
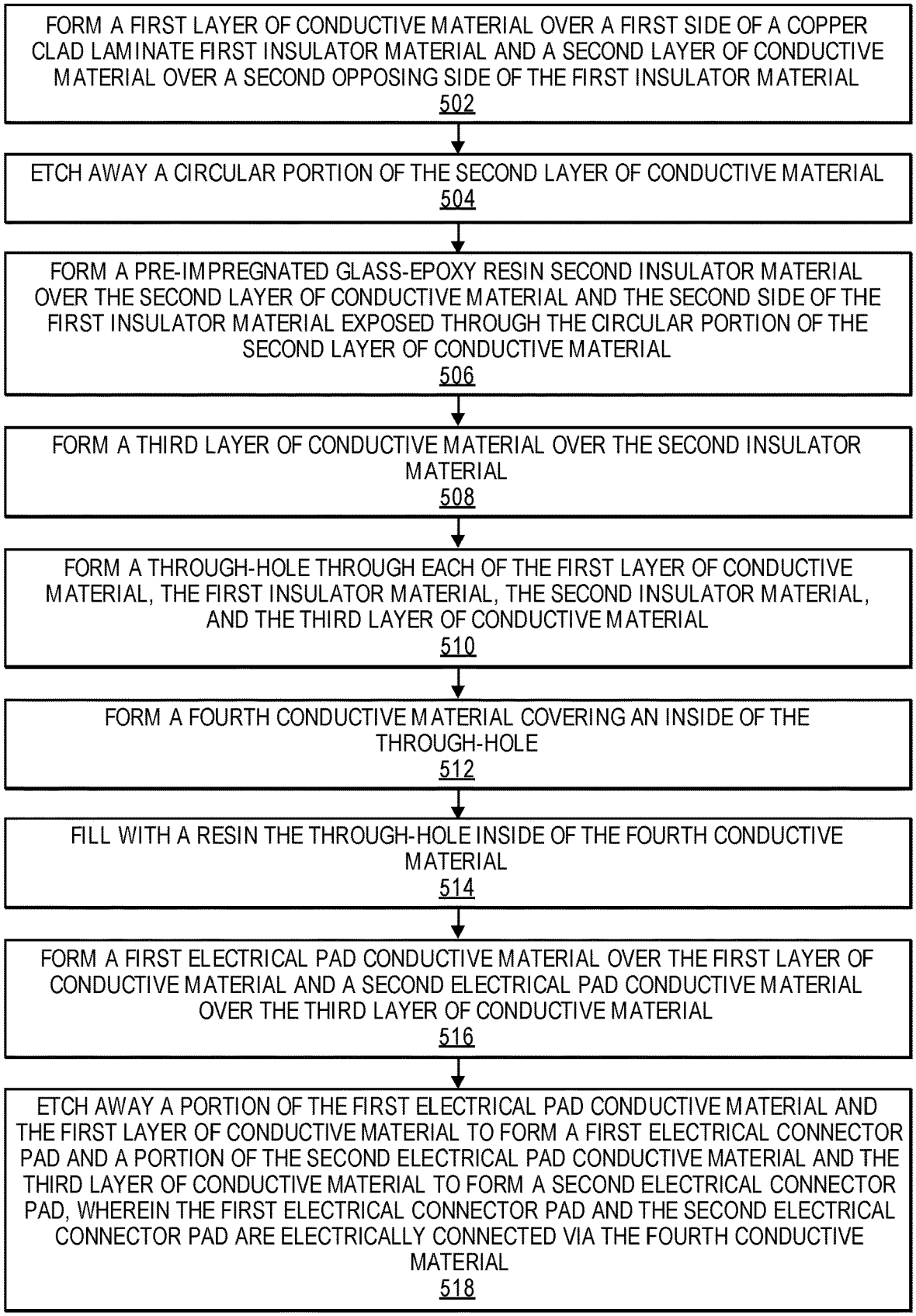
FIG. 5 is a flow diagram illustrating a method of manufacturing an electrical feed-through component, according to an embodiment.
Figure 6:
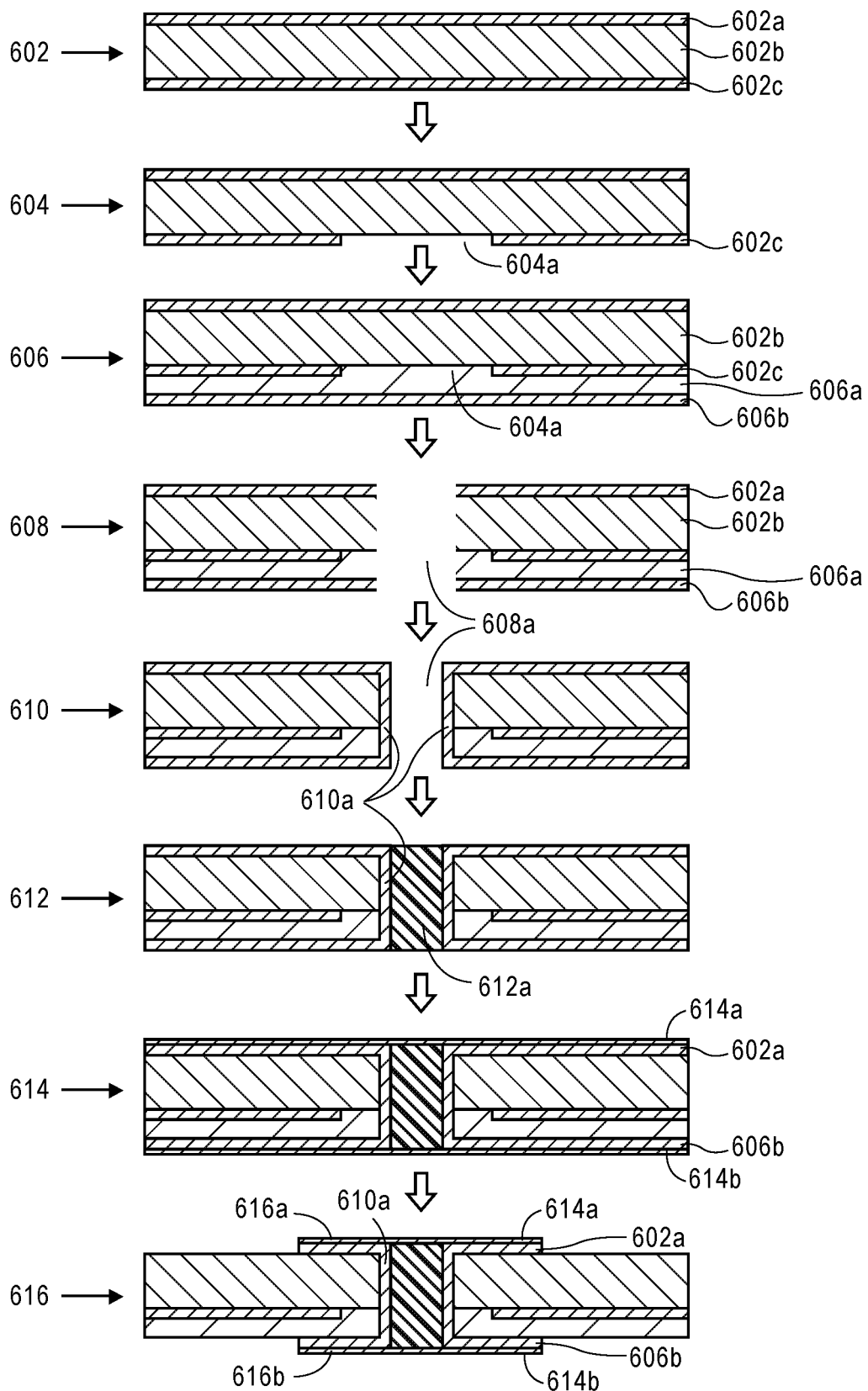
FIG. 6 is a side view diagram illustrating a process for manufacturing a low permeability electrical feed-through such as in FIG. 3A, according to an embodiment.

FIG. 5 is a flow diagram illustrating a method of manufacturing an electrical feed-through component, according to an embodiment. FIG. 6 is a side view diagram illustrating a process for manufacturing a low permeability electrical feed-through such as in FIG. 3A, according to an embodiment. Note that the process illustrated in FIG. 6 is from the top of the feed-through downward, as opposed to how feed-through 300 (FIGS. 3A, 3C, 4A, 4B) is described elsewhere herein from the bottom of the feed-through upward.

At block 502, form a first layer of conductive material over a first side of a copper clad laminate first insulator material and a second layer of conductive material over a second opposing layer side of the first insulator layer. For example, with reference to process step 602 (FIG. 6), form a first layer of conductive material 602a over a first side of a copper clad laminate first insulator material 602b and a second layer of conductive material 602c over a second opposing layer side of the first insulator layer 602b. For example, at block 502 the third conductor layer (L3) 310 (FIG. 3A) is formed over the top side of the second insulator layer (I2) 308 (FIG. 3A) and the second conductor layer (L2) 306 (FIG. 3A) is formed over the bottom side of the I2 layer.

At block 504, etch away a circular portion of the second layer of conductive material. For example, with reference to process step 604 (FIG. 6), etch away a circular portion 604a of the second layer of conductive material 602c. For example, at block 504 the through-hole 306a (FIG. 3A) is etched from the second conductor layer (L2) 306 (FIG. 3A).

At block 506, form a pre-impregnated glass-epoxy resin second insulator material over the second layer of conductive material and the second side of the first insulator material that is exposed through the circular portion of the second layer of conductive material. For example, with reference to process step 606 (FIG. 6), form a pre-impregnated glass-epoxy resin second insulator material 606a over the second layer of conductive material 602c and the second side of the first insulator material 602b that is exposed through the circular portion 604a of the second layer of conductive material 602c. For example, at block 506 the first insulator layer (I1) 304 (FIG. 3A) is laid up over the second conductor layer (L2) 306 (FIG. 3A) and the portion of the second insulator layer (I2) 308 (FIG. 3A) that is exposed through the through-hole 306a (FIG. 3A) of the second conductor layer (L2) 306, which forms the second portion 305 (FIG. 3A) of the first insulator layer 304.

At block 508, form a third layer of conductive material over the second insulator layer. For example, with reference to process step 606 (FIG. 6), form a third layer of conductive material 606b over the second insulator layer 606a. For example, at block 508 the first conductor layer (L1) 302 (FIG. 3A) is pressed over the first insulator layer (I1) 304 (FIG. 3A).

At block 510, form a through-hole through each of the first layer of conductive material, the first insulator layer material, the second insulator material, and the third layer of conductive material. For example, with reference to process step 608 (FIG. 6), form a through-hole 608a through each of the first layer of conductive material 602a, the first insulator layer material 602b, the second insulator material 606a, and the third layer of conductive material 606b. For example, at block 510 each through-hole 310a, 308a, 304a, 302a (FIG. 3A) is drilled through the respective third conductor layer (L3) 310 (FIG. 3A), the second insulator layer (I2) 308 (FIG. 3A), the first insulator (I1) 304 (FIG. 3A), and the first conductor layer (L1) 302 (FIG. 3A).

With respect to the optional use of a drilling operation to form one or more of the through-holes 302a, 304a, 308a, 310a, such a drilling operation may be in contrast with other approaches that may be known or used, such as a laser process. While a laser process may be limited to use with a certain maximum thickness of the first insulator layer 304 (e.g., less than 0.08 mm), by contrast, with a drilling operation the thickness of the first insulator layer 304 may be larger. It is appreciated, however, that thickening the first insulator layer 304 in order to provide additional rigidity and robustness to the feed-through 300 is at the expense of increasing the horizontal diffusion or leakage path associated with the first insulator layer 304. Thus, it would be preferable to provide additional rigidity and robustness to the feed-through 300, if desired, by thickening the second insulator layer 308 rather than the first insulator layer 304, and maintaining the thickness t1 (of first insulator layer 304) less than the thickness t2 (of second insulator layer 308).

At block 512, form a fourth conductive material covering an inside of the through-hole. For example, with reference to process step 610 (FIG. 6), form a fourth conductive material 610a covering an inside of the through-hole 608a. For example, at block 512 the electrically conductive annulus 312 (FIG. 3A) is plated in the collection of through-holes 310a, 308a, 304a, 302a (FIG. 3A).

At block 514, fill with a resin the through-hole inside the fourth conductive material. For example, with reference to process step 612 (FIG. 6), the through-hole inside of the fourth conductive material 610a is filled with a resin 612a. For example, at block 514 the inside of the electrically conductive annulus 312 (FIG. 3A) is filled with a resin 314, such as an embedded resin.

At block 516, form a first electrical pad conductive material over the first layer of conductive material and a second electrical pad conductive material over the third layer of conductive material. For example, with reference to process step 614 (FIG. 6), form a first electrical pad conductive material 614a over the first layer of conductive material 602a and a second electrical pad conductive material 614b over the third layer of conductive material 606b. For example, at block 516 electrical pad conductive material is plated over the first conductor layer (L1) 302 and the third conductor layer (L3) 310.

At block 518, etch away a portion of the first electrical pad conductive material and the first layer of conductive material to form a first electrical connector pad and a portion of the second electrical pad conductive material and the third layer of conductive material to form a second electrical connector pad, wherein the first electrical connector pad and the second electrical connector pad are electrically connected via the fourth conductive material. For example, with reference to process step 616 (FIG. 6), etch away a portion of the first electrical pad conductive material 614a and the first layer of conductive material 602a to form a first electrical connector pad 616a and a portion of the second electrical pad conductive material 614b and the third layer of conductive material 606b to form a second electrical connector pad 616b, wherein the first electrical connector pad 616a and the second electrical connector pad 616b are electrically connected via the fourth conductive material 610a. For example, at block 518 a portion of the first electrical pad conductive material and a portion of the first conductor layer (L1) 302 (FIG. 3A) are etched away to form the lower connector pad 318 and a portion of the second electrical pad conductive material and the third conductor layer (L3) 310 (FIG. 3A) are etched away to form the upper connector pad 316, wherein the lower connector pad 318 and the upper connector pad 316 are electrically connected via the electrically conductive annulus 312.

Extensions and Alternatives

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A method of manufacturing an electrical feed-through component, the method comprising:
    forming a first layer of conductive material over a first side of a copper clad laminate first insulator material and a second layer of conductive material over a second opposing side of said first insulator material;
    etching away a circular portion of said second layer of conductive material;
    forming a pre-impregnated glass-epoxy resin second insulator material over said second layer of conductive material and said second side of said first insulator material exposed through said circular portion of said second layer of conductive material;
    forming a third layer of conductive material over said second insulator material;
    forming a through-hole through each of said first layer of conductive material, said first insulator material, said second insulator material, and said third layer of conductive material;
    forming a fourth conductive material covering an inside of said through-hole;
    filling with a resin said through-hole inside of said fourth conductive material;
    forming a first electrical pad conductive material over said first layer of conductive material and a second electrical pad conductive material over said third layer of conductive material; and
    etching away a portion of said first electrical pad conductive material and said first layer of conductive material to form a first electrical connector pad and a portion of said second electrical pad conductive material and said third layer of conductive material and to form a second electrical connector pad;
    wherein said first electrical connector pad and said second electrical connector pad are electrically connected via said fourth conductive material.

2. The method of claim 1, wherein:
    said forming second insulator material includes forming a second insulator material having an anisotropic gas leak rate and positioned within said electrical feed-through such that said leak rate is lesser in a vertical direction than in a horizontal direction.

3. The method of claim 2, wherein:
said forming said second insulator material includes forming said second insulator material with a thickness that is less than a thickness of said first insulator material, thereby configuring a longer horizontal diffusion path through said second insulator material in the horizontal direction than in the vertical direction.

4. The method of claim 1, wherein:
said forming said second insulator material includes forming a diffusion path in a vertical direction through said second insulator material and through said first insulator material that is limited by a radial distance between said second layer of conductive material and said fourth conductive material.

5. The method of claim 1, wherein:
said etching away said circular portion of said second layer of conductive material and said etching away said portions of said third layer of conductive material and said second electrical pad conductive material include forming a capacitance area in which said second layer of conductive material partially overlaps with said third layer of conductive material and a ratio of said capacitance area to a thickness of said second insulator material is less than 10, to moderate a capacitive effect of said capacitance area.

6. A system for sealing an interface between a hermetically-sealed environment of an electronic component and an external environment, the system comprising:
means for limiting a diffusion path in a horizontal direction through an insulator layer of an electrical feed-through positioned at said interface.

7. The system of claim 6, further comprising:
means for limiting a diffusion path in a vertical direction through multiple insulator layers of said feed-through.

8. The system of claim 6, further comprising:
means for moderating a capacitive effect on high frequency electrical signals that transmit through a capacitance area within said feed-through.

* * * * *